United States Patent
Lin et al.

(10) Patent No.: US 9,859,000 B1
(45) Date of Patent: Jan. 2, 2018

(54) APPARATUS FOR PROVIDING ADJUSTABLE REFERENCE VOLTAGE FOR SENSING READ-OUT DATA FOR MEMORY

(71) Applicant: Winbond Electronics Corp., Taichung (TW)

(72) Inventors: Chi-Shun Lin, Taichung (TW); Ngatik Cheung, Taichung (TW); Douk-Hyoun Ryu, Taichung (TW); Seow-Fong Lim, Taichung (TW); Koying Huang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/185,037

(22) Filed: Jun. 17, 2016

(51) Int. Cl.
G11C 13/00 (2006.01)
(52) U.S. Cl.
CPC .... G11C 13/004 (2013.01); *G11C 2013/0054* (2013.01)
(58) Field of Classification Search
CPC ............ G11C 2013/0054; G11C 13/004
See application file for complete search history.

(56) References Cited

U.S. PATENT DOCUMENTS

| | | | | |
|---|---|---|---|---|
| 5,487,045 A * | 1/1996 | Trodden | ................ | G11C 16/28 365/185.21 |
| 6,445,170 B1 * | 9/2002 | Pangal | ................... | G05F 3/262 323/315 |
| 6,473,343 B2 * | 10/2002 | Ohba | ................... | G11C 16/28 327/51 |
| 7,595,684 B2 * | 9/2009 | Maejima | ................ | G11C 5/145 327/536 |
| 7,859,906 B1 * | 12/2010 | Vispute | ................. | G11C 16/28 365/185.2 |
| 8,723,595 B1 * | 5/2014 | Chen | ........................ | G05F 3/30 327/538 |
| 8,729,959 B1 * | 5/2014 | Chen | ........................ | G05F 3/30 327/538 |

(Continued)

OTHER PUBLICATIONS

Bang et al. ("Adaptive Read Voltage Control for Improvement of Read Disturbance and Power Consumption in Cross-point ReRAM", Proceedings of the 19th International Conference on Circuits, CSCC 2015, Jul. 16-20, 2015).*

(Continued)

*Primary Examiner* — Anthan Tran
*Assistant Examiner* — Mushfique Siddique
(74) *Attorney, Agent, or Firm* — JCIPRNET

(57) ABSTRACT

A data sensing apparatus adapted for sensing read-out data of a memory apparatus includes a sensing reference voltage generator, a sensing reference current generator, and a sense amplifier. The sensing reference voltage generator receives a reference voltage, generates a reference current according to the reference voltage and a control signal, and generates a sensing reference voltage according to the reference current. The sensing reference current generator receives the sensing reference voltage, and generates a sensing reference current according to the sensing reference voltage and the control signal. The sense amplifier receives the sensing reference current and a read-out current from the selected memory cell, and senses a current difference between the sensing reference current and the read-out current to generate the read-out data.

15 Claims, 3 Drawing Sheets

(56) References Cited

U.S. PATENT DOCUMENTS

| | | | | |
|---|---|---|---|---|
| 8,848,426 B2* | 9/2014 | Azuma | G11C 13/004 | 365/148 |
| 8,947,935 B2* | 2/2015 | Kim | G11C 7/12 | 365/185.17 |
| 8,994,387 B2* | 3/2015 | Chang | G01R 31/31713 | 324/691 |
| 9,312,001 B1* | 4/2016 | Huang | G11C 13/0064 | |
| 9,576,652 B1* | 2/2017 | Lim | G11C 13/004 | |
| 2005/0024129 A1* | 2/2005 | Jang | G05F 1/465 | 327/541 |
| 2006/0230206 A1* | 10/2006 | Park | G06F 13/4072 | 710/110 |
| 2007/0002630 A1* | 1/2007 | Gallo | G11C 7/062 | 365/185.19 |
| 2007/0081389 A1* | 4/2007 | Tran | G11C 7/02 | 365/185.21 |
| 2008/0024204 A1* | 1/2008 | Choy | G05F 1/46 | 327/538 |
| 2008/0218221 A1* | 9/2008 | Yen | H03G 1/0035 | 327/103 |
| 2008/0284501 A1* | 11/2008 | Kim | G05F 3/205 | 327/538 |
| 2009/0251981 A1* | 10/2009 | Huang | G11C 7/062 | 365/205 |
| 2011/0051495 A1* | 3/2011 | Ito | G11O 5/147 | 365/148 |
| 2011/0080101 A1* | 4/2011 | Chen | H05B 33/0827 | 315/193 |
| 2012/0038343 A1* | 2/2012 | Takagi | G05F 1/561 | 323/299 |
| 2012/0063195 A1* | 3/2012 | Lam | G11C 11/5642 | 365/148 |
| 2012/0283983 A1* | 11/2012 | Cheng | G01K 7/01 | 702/130 |
| 2012/0314478 A1* | 12/2012 | Ha | G11C 8/10 | 365/148 |
| 2013/0002352 A1* | 1/2013 | Jung | G11C 7/067 | 330/253 |
| 2013/0169259 A1* | 7/2013 | Saxena | G05F 3/30 | 323/313 |
| 2013/0201761 A1* | 8/2013 | Kim | G11C 16/28 | 365/185.17 |
| 2013/0307504 A1* | 11/2013 | Sato | G11C 5/148 | 323/282 |
| 2013/0308377 A1* | 11/2013 | Choi | G11C 13/004 | 365/163 |
| 2014/0003124 A1* | 1/2014 | Youn | G11C 13/004 | 365/148 |
| 2014/0021935 A1* | 1/2014 | Hung | G05F 1/56 | 323/313 |
| 2014/0036596 A1* | 2/2014 | Chan | G11C 16/28 | 365/185.21 |
| 2014/0084989 A1* | 3/2014 | Fujime | G05F 1/625 | 327/513 |
| 2014/0185401 A1* | 7/2014 | Yang | G11C 7/062 | 365/207 |
| 2014/0241070 A1* | 8/2014 | Wang | G11C 7/12 | 365/189.02 |
| 2015/0228315 A1 | 8/2015 | Wang et al. | | |
| 2015/0364188 A1* | 12/2015 | Lee | G11C 13/004 | 365/148 |
| 2016/0027485 A1* | 1/2016 | Park | G11C 29/021 | 365/191 |
| 2016/0071567 A1* | 3/2016 | Fujita | G11C 11/1673 | 365/148 |
| 2016/0078915 A1* | 3/2016 | Katayama | G11C 7/065 | 365/158 |
| 2016/0148678 A1* | 5/2016 | Park | G11C 13/004 | 365/148 |

OTHER PUBLICATIONS

"Office Action of Taiwan Counterpart Application," dated Sep. 4, 2017, p1-p4, in which the listed reference was cited.

* cited by examiner

APPARATUS FOR PROVIDING ADJUSTABLE REFERENCE VOLTAGE FOR SENSING READ-OUT DATA FOR MEMORY

BACKGROUND

Field of the Invention

The invention relates to a data sensing apparatus for a memory apparatus. Particularly, the invention relates to the data sensing apparatus for providing an adjustable reference voltage for sensing read-out data of the memory apparatus.

Description of Related Art

In recently years, non-volatile memory apparatuses are getting important in electronic products. Correspondingly, a resistive random access memory (RRAM) apparatus is provided.

In conventional art, a data sensing apparatus for the RRAM provides a sensing reference voltage with a constant voltage level. A sensing reference current can be generated according to the sensing reference voltage, and a sense amplifier of data sensing apparatus can sense the sensing reference current and a read-out current from a selected RRAM cell to obtain a read-out data. Since a RRAM margin read accuracy depends on a sensing reference voltage bias condition, such as that, the margin read are good during a first current range of the read-out current but fail during a second current range of the read-out current by using the sensing reference voltage with the constant voltage level.

SUMMARY OF THE INVENTION

The invention is directed to a plurality of data sensing apparatus, which provides dynamic sensing reference voltage to clamp a selected memory cell reading voltage.

The invention provides a data sensing apparatus adapted for sensing read-out data of a memory apparatus. The data sensing apparatus includes a sensing reference voltage generator, a sensing reference current generator, and a sense amplifier. The sensing reference voltage generator receives a reference voltage, generates a reference current according to the reference voltage and a control signal, and generates a sensing reference voltage according to the reference current. The sensing reference current generator is coupled to the sensing reference voltage generator, receives the sensing reference voltage, and generates a sensing reference current according to the sensing reference voltage and the control signal. The sense amplifier has a first input end being coupled to the sensing reference current generator and a second input end being coupled to a selected memory cell of the memory apparatus. The sense amplifier receives the sensing reference current and a read-out current from the selected memory cell, and senses a current difference between the reference current and the read-out current to generate the read-out data.

The invention provides another data sensing apparatus adapted for sensing read-out data of a memory apparatus. The data sensing apparatus includes an operation amplifier, a first transistor, a second transistor, a variable resistor, a sense amplifier and a third transistor. The operation amplifier has a first input end receiving a reference voltage, and an output end for providing a sensing reference voltage. The first transistor has a first transistor receiving a power voltage, a second end being coupled to a control end of the first transistor. The second transistor has a first end coupled to the second end of the first transistor, a control end directly receiving the sensing reference voltage, and a second end coupled to a second input end of the operation amplifier. The variable resistor is coupled between the second end of the second transistor and a reference ground, wherein a resistance of the variable resistor is determined according to a control signal, and a sensing reference current is generated according to the sensing reference voltage and the resistance of the variable resistor. The sense amplifier has a first input end coupled to the second end of the first transistor for receiving the sensing reference current, and an output end for generating a read-out data. The third transistor has a first end coupled to a second input end of the sense amplifier, and a control end directly receiving the sensing reference voltage, and a second end coupled to a selected memory cell.

According to the above descriptions, the sensing reference voltage can be dynamically adjusted, and the sensing reference voltage is self-adjusted to bias at a sensing reference current level at margin read and set verify/reset verify read levels for the memory apparatus. Furthermore, in present disclosure, the reference current and the sensing reference current are generated according to two matched circuit. Such as that, the margin read accuracy of the memory apparatus can be ensured.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
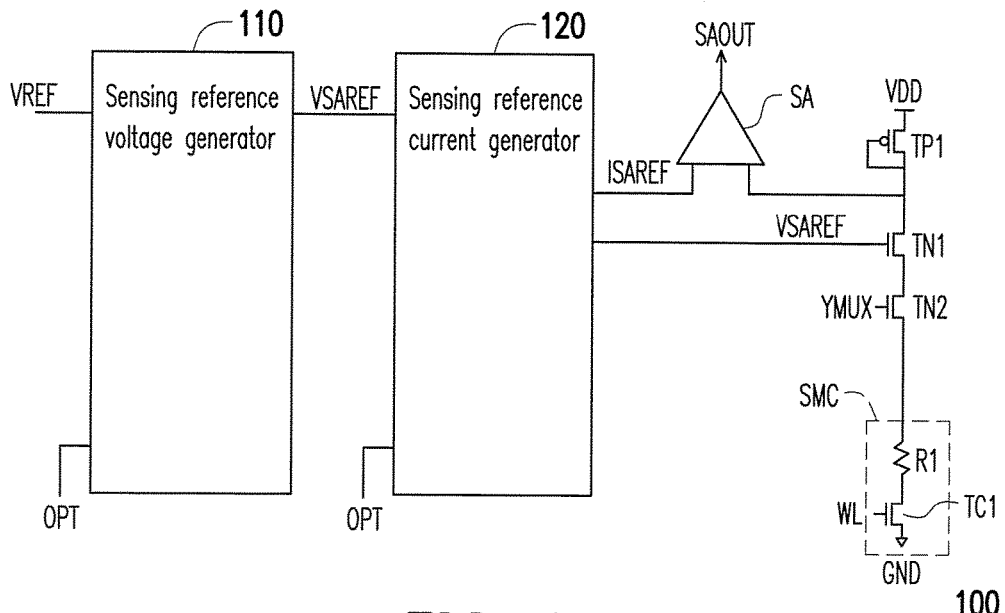
FIG. 1 illustrates a schematic plot of a data sensing apparatus according to an embodiment of present disclosure.

Referring to FIG. 1, FIG. 1 illustrates a schematic plot of a data sensing apparatus according to an embodiment of present disclosure. The data sensing apparatus 100 is used to sense read-out data of a memory apparatus. The data sensing apparatus 100 includes a sensing reference voltage generator 110, a sensing reference current generator 120, and a sense amplifier SA. The sensing reference voltage generator 110 receives a reference voltage VREF, generates a reference current according to the reference voltage VREF and a control signal OPT, and generates a sensing reference voltage VSAREF according to the reference current. The sensing reference current generator 120 is coupled to the sensing reference voltage generator 110. The sensing reference current generator 120 receives the sensing reference voltage VSAREF and generates a sensing reference current ISAREF according to the sensing reference voltage VSAREF and the control signal OPT. The sense amplifier SA has a first input end and a second input end, the first input end is coupled to the sensing reference current generator 120 for receiving the sensing reference current ISAREF, and the second input end is coupled to a selected memory cell SMC for receiving a read-out current from the selected memory cell SMC. The sense amplifier SA senses a current difference between the sensing reference current ISAREF and the read-out current to generate the read-out data SAOUT.

It should be noted here, a voltage level of the sensing reference voltage VSAREF is not constant in present embodiment. The voltage level of the sensing reference voltage VSAREF is determined according to the reference current generated by the sensing reference voltage generator 110, and a current level the reference current of the sensing reference voltage generator 110 may be determined according to the control signal OPT. Furthermore, the sensing reference voltage VSAREF is transported to the sensing reference current generator 120, and the sensing reference current generator 120 is biased by the sensing reference voltage VSAREF for generating the sensing reference current ISAREF according to the control signal OPT.

The control signal OPT provided to the sensing reference voltage generator 110 and the sensing reference current generator 120 are the same, and circuit schemes for generating the reference current and the sensing reference current ISAREF are the same. That is, the sensing reference voltage VSAREF is self-adjusted, and the sensing reference current ISAREF can be good tracking with a margin read reference current. A better margin read cross all read-out current range may be obtained.

In additional, the sense amplifier SA may be coupled to the selected memory cell SMC through transistors TN1 and TN2. The transistor TN1 is coupled between the second input end of the sense amplifier SA and the transistor TN2, and the transistor TN1 is controlled by the sensing reference voltage VSAREF. The transistor TN2 is coupled between the transistor TN1 and the selected memory cell SMC, and is controlled by a selecting signal YMUX. When the selected memory cell SMC is selected for data read operation, the transistor TN2 is turned on by the selecting signal YMUX, and the read-out current may be transported to the second input end of the sense amplifier SA. Moreover, a transistor TP1 is coupled between a power voltage VDD and the second input end of the sense amplifier SA. Control end and second end of the transistor TP1 are connected together, and a first end of the transistor TP1 receives the power voltage VDD.

In this embodiment, the selected memory cell SMC may be a resistive memory cell (ReRAM), and the selected memory cell SMC may include a resistor R1 and a transistor TC1 which is controlled by a word line signal WL (1T1R memory cell). Of course, the selected memory cell SMC is not limited to the 1T1R memory cell, the selected memory cell SMC also can be any type resistive memory cell known by a person skilled in the art. The selected memory cell SMC may be, such as 1R (one resistor), 1D1R (one diode and one resistor), 1S1R (one selector and one resistor), 1BJT1R (one bipolar transistor and one resistor), or complementary resistive switching (CRS) memory cell.

Furthermore, in another embodiments, the selected memory cell SMC may also be any other type of resistive memory cell, such as phase-change memory (PCM), magnetoresistive random access memory (MRAM), ferroelectric random access memory (FRAM), or conductive-bridging random access memory (CBRAM) cell.

Besides, the selected memory cell SMC may also not resistive memory cell. In some embodiment, the selected memory cell SMC may also be any other type non-volatile memory cell.

Figure 2:
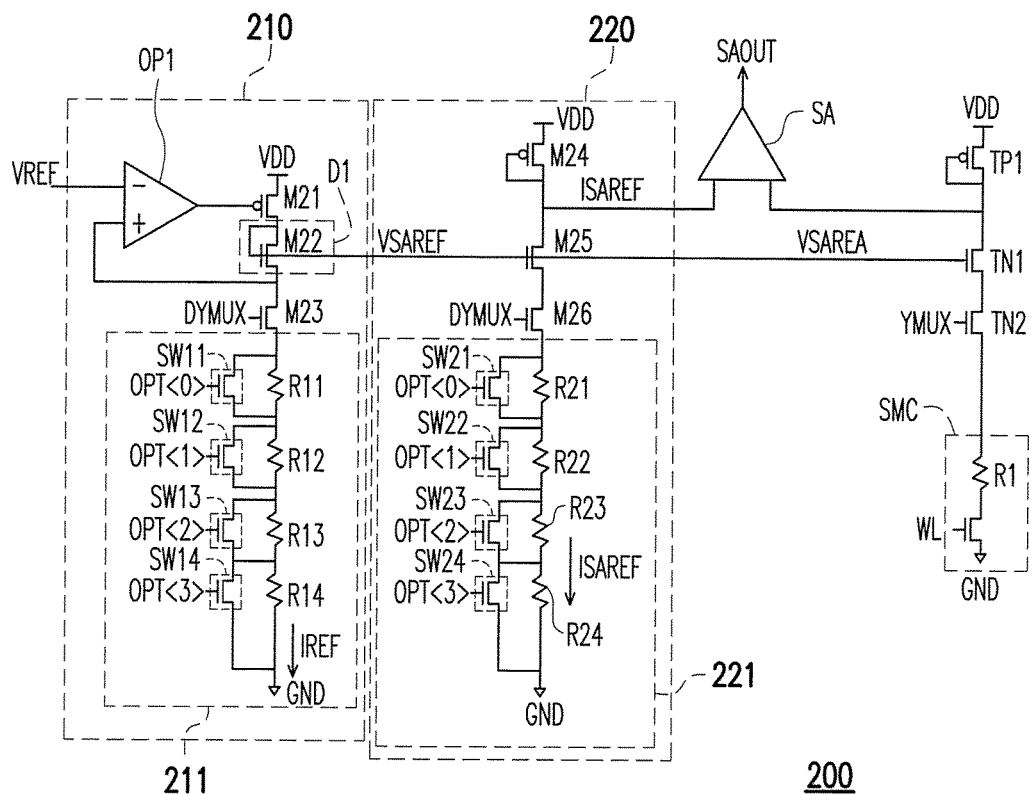
FIG. 2 illustrates a schematic plot of a data sensing apparatus according to another embodiment of present disclosure.

Referring to FIG. 2, FIG. 2 illustrates a schematic plot of a data sensing apparatus according to another embodiment of present disclosure. The data sensing apparatus 200 includes a sensing reference voltage generator 210, a sensing reference current generator 220, and a sense amplifier SA. The sensing reference voltage generator 210 includes an operation amplifier OP1, transistors M21-M23, and a variable resistor 211. The operation amplifier OP1 has a negative input end receiving a reference voltage VREF, and a positive input end coupled to a diode D1 formed by the transistor M22. An output end of the operation amplifier OP1 is coupled to a control end of the transistor M21. A first end of the transistor M21 receives the power voltage VDD, and a second end of the transistor M21 is coupled to an anode of the diode D1. The anode of the diode D1 generates the sensing reference voltage VSAREF. A cathode of the diode D1 is coupled to the transistor M23, a second end of the transistor M23 is coupled to the variable resistor 211, and a control end of the transistor M23 receives a dummy selecting signal DYMUX. The variable resistor 211 includes switches SW11-SW14 and resistors R11-R14. The switches SW11-SW14 are coupled in series between the transistor M23 and a reference ground GND, and the resistors R11-R14 are also coupled in series between the transistor M23 and the reference ground GND. The switches SW11-SW14 are respectively coupled to the resistors R11-R14 in parallel, and the switches SW11-SW14 are respectively controlled by a plurality bits of the control signal OPT<0>-OPT<3>. Wherein, the switches SW11-SW14 are implemented by N-type transistors.

On or off statuses of the switches SW11-SW14 are used to determine a resistance of the variable resistor 211. For example, if all of the switches SW11-SW14 are cut-off, the resistance of the variable resistor 211 equals to a summation of resistances of the resistors R11-R14. If the switches SW11-SW12 are turned on, and the switches SW13-SW14 are cut-off, the resistance of the variable resistor 211 equals to a summation of resistances of the resistors R13-R14.

On the other hand, the sensing reference current generator 220 includes transistors M24-M26 and a variable resistor 221. A first end of the transistor M24 receives the power voltage VDD, and a second end and control end are coupled together to the first end of the transistor M25 and a first input end of the sense amplifier SA. A second end of the transistor M25 is coupled to the transistor M26 and a control end of the transistor M25 receives the sensing reference voltage VSAREF. The transistor M26 is coupled between the transistor M25 and the variable resistor 221, and controlled by the dummy selecting signal DYMUX. Circuit configurations of the variable resistors 211 and 221 are similar. The variable resistors 221 includes switches SW21-SW24 and resistors R21-R24. The switches SW21-SW24 are coupled in series between the transistor M26 and the reference ground GND, and the resistors R21-R24 are also coupled in series between the transistor M26 and the reference ground GND. The switches SW21-SW24 are respectively coupled to the resistors R21-R24 in parallel, and the switches SW21-SW24 are respectively controlled by the plurality bits of the control signal OPT<0>-OPT<3>.

In this embodiment, the resistances of the resistors R11-R14 respectively equal to the resistances of the resistors R21-R24, and the resistance provided by the variable resistor 211 and the resistance provided by the variable resistor 212 may be the same.

In detail operation of the data sensing apparatus 210, the cathode of the diode D1 is biased at the reference voltage VREF by the operation amplifier OP1, and the reference current IREF is generated by dividing the reference voltage VREF by the resistance of the variable resistor 211 (the transistor M23 is turned on). Such as that, the reference current IREF may be received by the diode D1, and the sensing reference voltage VSAREF may be generated at the anode of the diode D1. It can be easily seen, the voltage level of the sensing reference voltage VSAREF can be adjusted by changing on or off status of at least one of the switches SW11-SW14.

The sensing reference voltage VSAREF is provided to bias the transistor M25, and the transistor M25 may provide a bias voltage at second end thereof accordingly. Such as that, the sensing reference current ISAREF may be generated according to the bias voltage and the resistance of the variable resistor 221.

That is, the sensing reference voltage VSAREF of present disclosure can be adjusted dynamically, and the sensing reference current ISAREF can be adjusted accordingly to create margin read current steps or set or reset verify current levels.

Additional, in FIG. 2, the transistors M23 and M26 are provided for circuit matching with the transistor TN2, and the transistors M23, M26 and TN2 may be turned on during a same time period.

Figure 3:
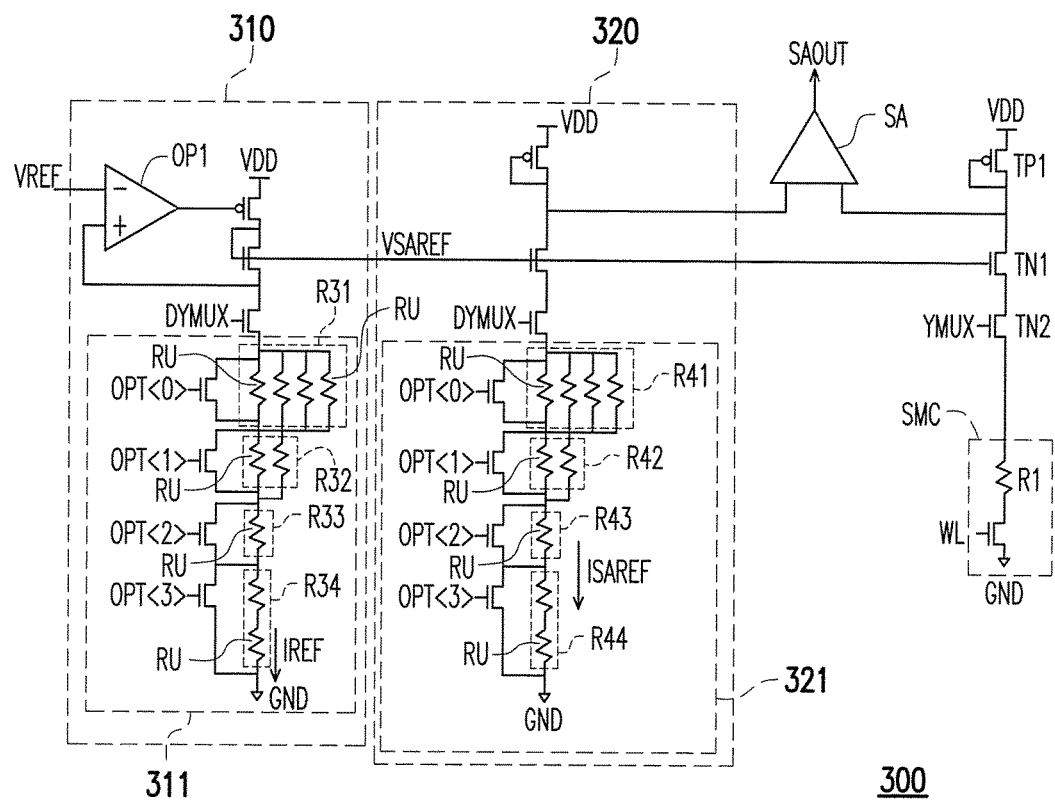
FIG. 3 illustrate a schematic diagram of a data sensing apparatus according to another embodiment of present disclosure.

Referring to FIG. 3, FIG. 3 illustrate a schematic diagram of a data sensing apparatus according to another embodiment of present disclosure. The data sensing apparatus 300 includes a sensing reference voltage generator 310, a sensing reference current generator 320, and a sense amplifier SA. Different from the data sensing apparatus 200, each of the resistors R31-R34 and R41-R44 may be implemented by one or more unit resistors RU. In detail, each of the resistors R31 and R41 is implemented by four unit resistors RU coupled in parallel; each of the resistors R32 and R42 is implemented by two unit resistors RU coupled in parallel; each of the resistors R33 and R43 is implemented by one unit resistor RU; and each of the resistors R34 and R44 is implemented by two unit resistors RU coupled in series, wherein resistances of all of the unit resistors are the same. That is, a ratio between resistances of the resistors R31-R34 may be 1:2:4:8, and a ratio between resistances of the resistors R41-R44 may be 1:2:4:8.

The unit resistor RU may be a poly resistor, a heavy fonning resistive random access memory (RRAM) cell, a non ial set or reset RRAM cell, or a traditional non-volatile memory (NVM) cell.

In this embodiment, the variable resistors 311 and 321 may respectively select one of the resistors R31-R34 and one of the resistors R41-R44 to provide the resistances of the variable resistors 311 and 321. That is, a plurality of margin current read steps, or set or reset verify levels can be created.

Figure 4:
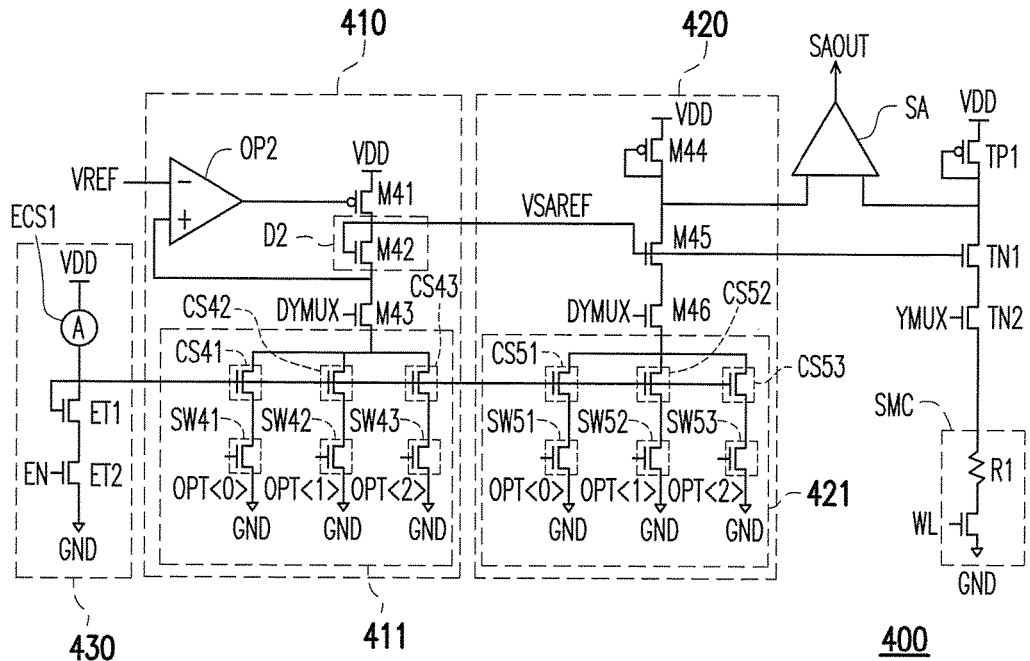
FIG. 4 illustrates a schematic plot of a data sensing apparatus according to another embodiment of present disclosure.

Referring to FIG. 4, FIG. 4 illustrates a schematic plot of a data sensing apparatus according to another embodiment of present disclosure. The data sensing apparatus 400 includes a sensing reference voltage generator 410, a sensing reference current generator 420, and a sense amplifier SA. The sensing reference voltage generator 410 includes an operation amplifier OP2, transistors M41-M43, and variable current generator 411. The operation amplifier OP2 has a negative input end receiving a reference voltage VREF, and a positive input end coupled to a diode D2 formed by the transistor M42. An output end of the operation amplifier OP2 is coupled to a control end of the transistor M41. A first end of the transistor M41 receives the power voltage VDD, and a second end of the transistor M41 is coupled to an anode of the diode D2. The anode of the diode D2 generates the sensing reference voltage VSAREF by receiving a reference current IREF which is generated by the variable current generator 411. A cathode of the diode D2 is coupled to the transistor M43, a second end of the transistor M43 is coupled to the variable current generator 411, and a control end of the transistor M43 receives a dummy selecting signal DYMUX. The variable current generator 411 is coupled between the transistor M43 and the reference ground GND. The variable current generator 411 include a plurality of current sources CS41-CS43 and a plurality of switches SW41-SW43. The current sources CS41-CS43 are respectively coupled to the switches SW41-SW43 in series, and the current sources CS41-CS43 and the switches SW41-SW43 may be respectively implemented by a plurality of transistors.

The switches SW41-SW43 are respectively controlled by a plurality of bits of control signal OPT<0>-OPT<2>. On or off statuses of the switches SW41-SW43 are used to determine a current level of the reference current IREF. For example, if only the switch SW41 is turned on, the current level of the reference current IREF equals to a current level of the current source CS41; if only the switch SW42 is turned on, the current level of the reference current IREF equals to a current level of the current source CS42; and if only the switch SW43 is turned on, the current level of the reference current IREF equals to a current level of the current source CS43.

On the other hand, the sensing reference current generator 420 includes transistors M44-M46 and a variable current generator 421. A first end of the transistor M44 receives the power voltage VDD, and a second end and control end of the transistor M44 are coupled together to the first end of the transistor M45 and a first input end of the sense amplifier SA. A second end of the transistor M45 is coupled to the transistor M46 and a control end of the transistor M45 receives the sensing reference voltage VSAREF. The transistor M46 is coupled between the transistor M45 and the variable current generator 421, and controlled by the dummy selecting signal DYMUX. Circuit configurations of the variable resistors 411 and 421 are similar. The variable current generator 421 includes switches SW51-SW53 and current sources CS51-CS53. The switches SW51-SW53 are respectively coupled to the current sources CS51-CS53 in series between the transistor M45 and the reference ground GND, and the switches SW51-SW53 are respectively controlled by the plurality bits of the control signal OPT<0>-OPT<2>.

The switches SW51-SW53 are respectively controlled by the plurality of bits of control signal OPT<0>-OPT<2>. On or off statuses of the switches SW51-SW53 are used to determine a current level of a sensing reference current ISAREF.

The sense amplifier SA receives the sensing reference current ISAREF and a read-out current from the selected memory cell SMC, and obtains a read-out data SAOUT by sensing a current difference between the sensing reference current ISAREF and the read-out current.

It should be noted here, the current sources CS41-CS43 and CS51-CS53 respectively generates a plurality currents by mirroring an input current. The input current may be provided by an input current generator 430. The input current generator 430 includes a current source ECS1 and transistors ET1 and ET2. The current source ECS1 receives the power voltage VDD and provides the input current to the transistor ET1. A first end and a control end of the transistor ET1 are coupled together to receive the input current generated by the current source ECS1. A second end of the transistor ET1 is coupled to the transistor ET2. The transistor ET2 is coupled between the transistor ET1 and the reference ground GND, and is controlled by an enable signal EN to be turned on or cut off.

In some embodiment, current levels of the currents respectively provided by the current sources CS41-CS43 may be different, and a ratio of the current levels provided by the current sources CS41-CS43 may be 1:2:4. Also, current levels of the currents respectively provided by the current sources CS51-CS53 may be different, and a ratio of the current levels provided by the current sources CS51-CS53 may be 1:2:4. Wherein, the current levels provided by the current sources CS41 and CS51 may equal to the current level of the input current.

Figure 5:
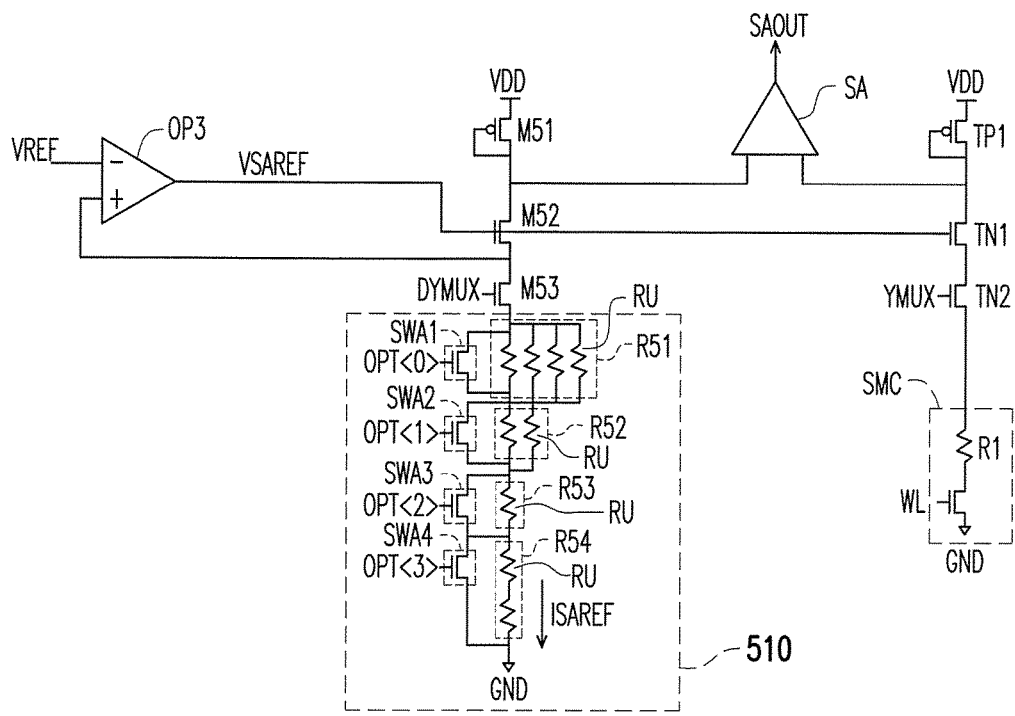
FIG. 5 illustrates a schematic plot of a data sensing apparatus according to another embodiment of present disclosure.

Referring to FIG. 5, FIG. 5 illustrates a schematic plot of a data sensing apparatus according to another embodiment of present disclosure. The data sensing apparatus 500 includes an operation amplifier OP3, transistors M51-M53, a variable resistor 510, and a sense amplifier SA. The operation amplifier OP3 has a first input end for receiving a reference voltage VREF, and an output end for providing a sensing reference voltage VSAREF. The transistor M51 has a first end for receiving a power voltage VDD, a second end being coupled to a control end thereof. The transistor M52 has a first end being coupled to the second end of the transistor M51, a control end for directly receiving the sensing reference voltage VSAREF, and a second end being coupled to a second input end of the operation amplifier OP3 and a first end of the third transistor M53. The transistor M53 has a control end directly receiving a selecting signal DYMUX, and a second end being coupled to the variable resistor 510. The variable resistor 510 is coupled between the second end of the transistor M53 and a reference ground GND, wherein a resistance of the variable resistor 510 is determined according to a plurality of bits of a control signal OPT<0>-OPT<3>, and a sensing reference current ISAREF is generated according to the sensing reference voltage VSAREF and the resistance of the variable resistor 510. The sense amplifier SA has a first input end being coupled to the second end of the transistor M51 for sensing the sensing reference current ISAREF, and an output end for generating a read-out data SAOUT. Furthermore, a second input end of the sense amplifier SA is coupled to the selected memory cell SMC through transistors TN1 and TN2. A control end of the transistor TN1 directly receives the sensing reference voltage VSAREF, and a read-out current from the selected memory cell SMC can be transported through the transistor TN1, and the read-out current can be sensed by a second input end of the sense amplifier SA.

The variable resistor 510 includes a plurality of switches SWA1-SWA4 and a plurality of resistors R51-R54. The switches SWA1-SWA4 are coupled in series between the transistor M53 and the reference ground GND. The resistors R51-R54 are coupled in series between the transistor M53 and the reference ground GND. The switches SWA1-SWA4 are respectively coupled to resistors R51-R54 in parallel.

Each of the resistors R51-R54 may be implemented by one or more unit resistors RU. In this embodiment, the resistor R51 is implemented by four unit resistors RU coupled in parallel; the resistor R52 is implemented by two unit resistors RU coupled in parallel; the resistor R53 is implemented by one unit resistor RU; and the resistor R54 is implemented by two unit resistors RU coupled in series. All of the unit resistors RU in FIG. 5 are the same, and a ratio of the resistances of the resistors R51-R54 is 1:2:4:8.

A resistance of the variable resistor 510 can be determined by tuning off at least one of the switches SWA1-SWA4, and a current level of the sensing reference current ISAREF can be generated according to the sensing reference voltage VSAREF.

That is, the sensing reference current ISAREF can be adjusted to create margin read current steps or set or reset verify current levels.

In summary, the present disclosure provides the sensing reference voltage generator generates the sensing reference voltage, and the sensing reference voltage can be dynamically adjusted, and the sensing reference voltage is self-adjusted to bias at a sensing reference current level at margin read and set verify/reset verify read levels for the memory apparatus. Such as that, the margin read accuracy of the memory apparatus can be ensured.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data sensing apparatus, being configured to sense read-out data of a memory apparatus, comprising:
   a sensing reference voltage generator, receiving a reference voltage, generating a reference current according to the reference voltage and a control signal, and generating a sensing reference voltage according to the reference current;
   a sensing reference current generator, coupled to the sensing reference voltage generator, receiving the sensing reference voltage, and generating a sensing reference current according to the sensing reference voltage and the control signal; and
   a sense amplifier, having a first input end being coupled to the sensing reference current generator and a second input end being coupled to a selected memory cell of the memory apparatus, receiving the sensing reference current and a read-out current from the selected memory cell, and sensing a current difference between the sensing reference current and the read-out current to generate the read-out data,
   wherein the sensing reference voltage generator comprises:
      an operation amplifier, having a first input end receiving the reference voltage;
      a first transistor, having a first end receiving a power voltage, a control end coupled to an output end of the operation amplifier;
      a diode, having an anode being coupled to a second end of the first transistor, a cathode coupled to a second end of the operation amplifier, wherein the sensing reference voltage is generated at the anode of the diode; and
      a first variable resistor, coupled between the cathode of the diode and a reference ground, wherein a resistance of the first variable resistor is determined by the control signal, wherein the first variable resistor comprises:
a plurality of switches and a plurality of resistors, wherein the switches are coupled in series between the cathode of the diode and the reference ground, the resistors are coupled in series between the cathode of the diode and the reference ground, and the switches are respectively coupled to the resistors in parallel,
wherein, the switches are respectively controlled by a plurality of bits of the control signal.

2. The data sensing apparatus as claimed in claim 1, wherein the sensing reference current generator comprises:
a second transistor, having a first end receiving the power voltage, and a second end coupled to a control end;
a third transistor, having a first end coupled to the second end of the second transistor, a control end receiving the sensing reference voltage; and
a second variable resistor, coupled between a second end of the third transistor and the reference ground, wherein a resistance of the second variable resistor is determined by the control signal, and the resistances of the first and second variable resistors are substantially equaled.

3. The data sensing apparatus as claimed in claim 2, wherein the second variable resistor comprises:
a plurality of switches and a plurality of resistors, wherein the switches are coupled in series between the second end of the third transistor and the reference ground, the resistors are coupled in series between the second end of the third transistor and the reference ground, and the switches are respectively coupled to the resistors in parallel,
wherein, the switches are respectively controlled by a plurality of bits of the control signal.

4. The data sensing apparatus as claimed in claim 1, wherein the sensing reference voltage generator comprises:
an operation amplifier, having a first input end receiving the reference voltage;
a first transistor, having a first end receiving a power voltage, a control end coupled to an output end of the operation amplifier;
a diode, having an anode being coupled to a second end of the first transistor, a cathode coupled to a second end of the operation amplifier, wherein the sensing reference voltage is generated at the anode of the diode; and
a first variable current generator, coupled between the cathode of the diode and a reference ground, wherein the first variable current generator generates the reference current according to the control signal and an input current.

5. The data sensing apparatus as claimed in claim 4, wherein the first variable current generator comprises:
a plurality of switches; and
a plurality of current sources,
wherein the switches are respectively coupled to the current sources in series between the cathode of the diode and the reference ground, the current sources respectively generate a plurality of current by mirroring the input current, and the switches are respectively controlled by a plurality bits of the control signal.

6. The data sensing apparatus as claimed in claim 4, wherein the sensing reference current generator comprises:
a second transistor, having a first end receiving the power voltage, and a second end coupled to a control end;
a third transistor, having a first end coupled to the second end of the second transistor, a control end receiving the sensing reference voltage; and
a second variable current generator, coupled between a second end of the third transistor and the reference ground, wherein the second variable current generator generates the sensing reference current according to the control signal and the input current,
wherein current values of the reference current and the sensing reference current are substantially equaled.

7. The data sensing apparatus as claimed in claim 6, wherein the second variable current generator comprises:
a plurality of switches; and
a plurality of current sources,
wherein the switches are respectively coupled to the current sources in series between the second end of the third transistor and the reference ground, the current sources respectively generate a plurality of current by mirroring the input current, and the switches are respectively controlled by a plurality bits of the control signal.

8. The data sensing apparatus as claimed in claim 4, further comprising:
an input current generator, coupled to the reference current generator and the sensing reference current generator, wherein the input current generator comprises:
a current source;
a second transistor, having a first end coupled to the current source, and a control end coupled to the first end of the second transistor, wherein the input current is generated at the control end of the second transistor; and
an enable switch, coupled between a second end of the second transistor and the reference ground, and being controlled by an enable signal.

9. The data sensing apparatus as claimed in claim 1, wherein the selected memory cell is a non-volatile memory cell.

10. The data sensing apparatus as claimed in claim 1, wherein the selected memory cell is a resistive memory cell, a phase-change memory cell, a magnetoresistive random access memory cell, a ferroelectric random access memory, or a conductive-bridging random access memory cell.

11. The data sensing apparatus as claimed in claim 10, wherein if the selected memory cell is the resistive memory cell, the selected memory cell is a one resistor memory cell, a one diode and one resistor memory cell, a one selector and one resistor memory cell, a one bipolar transistor and one resistor memory cell, or a complementary resistive switching memory cell.

12. A data sensing apparatus, comprising:
an operation amplifier, having a first input end receiving a reference voltage, and an output end for providing a sensing reference voltage;
a first transistor, having a first end receiving a power voltage, a second end coupled to a control end of the first transistor;
a second transistor, having a first end coupled to the second end of the first transistor, a control end directly receiving the sensing reference voltage, and a second end coupled to a second input end of the operation amplifier;
a variable resistor, wherein a first end of the variable resistor is coupled to the second end of the second transistor and a second end of the variable resistor is coupled to a reference ground, wherein a resistance of the variable resistor is determined according to a control signal, and a sensing reference current is generated according to the sensing reference voltage and the resistance of the variable resistor;

a sense amplifier, having a first input end coupled to the second end of the first transistor for sensing the sensing reference current, a second input end coupled to a selected memory cell for sensing a read-out current from the selected memory cell, and an output end for generating a read-out data; and a third transistor, having a first end coupled to a second input end of the sense amplifier, and a control end directly receiving the sensing reference voltage, and a second end coupled to a selected memory cell, wherein the variable resistor comprises:

a plurality of switches and a plurality of resistors, wherein the switches are coupled in series between the second end of the second transistor and the reference ground, the resistors are coupled in series between the second end of the second transistor and the reference ground, and the switches are respectively coupled to the resistors in parallel, wherein, the switches are respectively controlled by a plurality of bits of the control signal.

13. The data sensing apparatus as claimed in claim 12, wherein the selected memory cell is a non-volatile memory cell.

14. The data sensing apparatus as claimed in claim 12, wherein the selected memory cell is a resistive memory cell, a phase-change memory cell, a magnetoresistive random access memory cell, a ferroelectric random access memory, or a conductive-bridging random access memory cell.

15. The data sensing apparatus as claimed in claim 14, wherein if the selected memory cell is the resistive memory cell, the selected memory cell is a one resistor memory cell, a one diode and one resistor memory cell, a one selector and one resistor memory cell, a one bipolar transistor and one resistor memory cell, or a complementary resistive switching memory cell.

* * * * *